United States Patent [19]

Shookhtim et al.

[11] Patent Number: 5,047,980

[45] Date of Patent: Sep. 10, 1991

[54] BICMOS MEMORY HAVING MEMORY CELLS CONNECTED DIRECTLY TO ADDRESS DECODERS

[75] Inventors: Rimon Shookhtim, La Jolla; Lo-Shan Lee, San Diego; Babak Mansoorian, La Jolla, all of Calif.

[73] Assignee: Unisys Corporation, Blue Bell, Pa.

[21] Appl. No.: 569,673

[22] Filed: Aug. 17, 1990

[51] Int. Cl.[5] ..................... G11C 11/36; G11C 11/407
[52] U.S. Cl. .................................. 365/177; 365/190; 307/446; 357/43
[58] Field of Search .................... 365/177, 174, 189.01, 365/190, 191, 189.06, 189.11; 357/43; 307/446

[56] References Cited

U.S. PATENT DOCUMENTS

| | | | |
|---|---|---|---|
| 4,858,183 | 8/1989 | Scharrer et al. | 365/174 |
| 4,866,673 | 9/1989 | Higuchi et al. | 365/177 |
| 4,961,170 | 10/1990 | Maki et al. | 365/177 |

Primary Examiner—Alyssa H. Bowler
Attorney, Agent, or Firm—Charles J. Fassbender; Mark T. Starr

[57] ABSTRACT

A digital BiCMOS memory chip includes a row of memory cells, and an addressing circuit for the row of cells. Each of the memory cells is constructed of field-effect transistors which operate at CMOS voltage levels, whereas the address decorder is constructed of bipolar transistors which operate at ECL voltage levels. A direct connection is made via a row line from the address decoder to the row of memory cells with no ECL-to-CMOS voltage level converter lying there between. This direct connection is made operable by properly selecting all voltages that occur on certain nodes in the address decoder and the memory cell. And, it enables the memory to be read faster plus occupy less chip space and dissipate less power than the prior art.

12 Claims, 4 Drawing Sheets

BICMOS MEMORY HAVING MEMORY CELLS CONNECTED DIRECTLY TO ADDRESS DECODERS

BACKGROUND OF THE INVENTION

This invention relates to digital memories; and more particularly, it relates to low-power high-speed high-density BiCMOS static memory chips.

BiCMOS memory chips are made partially of bipolar transistors and partially of CMOS transistors. Conventionally, on a BiCMOS memory chip, the CMOS transistors form thousands of memory cells, while the bipolar transistors receive and decode address input signals which select a particular cell. This is indicated in FIG. 1 wherein reference numeral 10 identifies one of the memory cells and reference numeral 20 identifies one address decoder which selects the memory cell 10.

Such a BiCMOS memory chip architecture is currently in wide use because it provides both a large number of cells and a fast operating speed. Other prior art memory chips which are made entirely of just CMOS transistors operate slower; while still other prior art memory chips which are made entirely of bipolar transistors provide fewer memory cells for any given chip size.

However, the bipolar address decoder 20 and the CMOS memory cell 10 in the FIG. 1 BiCMOS memory chip require different level digital signals in order to operate properly. Decoder 20 operates on "ECL" digital address signals while memory cell 10 operates digital "CMOS" signals. ECL signals have high and low levels that differ from each other by less than one volt, while "CMOS" signals which have high and low levels that differ from each other by at least three volts. For example, commonly used ECL high and low levels are −0.8 and −1.6 volts, and commonly used CMOS high and low levels commonly 0 and −5.2 volts.

Conventionally, to make the bipolar decoder operate with the CMOS memory cell, an ECL-to-CMOS voltage level translator 30 is disposed between them. Many examples of these voltage translator circuits as used in BiCMOS memory chips are described in the prior art.

For example, see FIG. 3 of a technical paper by Matsui et al entitled "An 8-ns 1-Mbit ECL BiCMOS SRAM with Double-Latch ECL-to-CMOS-Level Converters" in the IEEE Journal of solid state circuits, of Vol. 24, No. 5, October 1989, pages 1226–1231. See also FIG. 8 in a technical paper by Tamba et al entitled "An 8-ns 256K BiCMOS RAM" in the IEEE Journal of Solid State Circuits, Vol. 24, No. 4, August 1989, pages 1021–1026. See further FIG. 4 of a technical paper by Kertis et al entitled "A 12-ns ECL I/O 256 KX1-bit SRAM Using a 1-um BiCMOS Technology" in the IEEE Journal of Solid States Circuits, Vol. 23, No. 5, October 1988 pages 1048–1053.

However, all ECL-to-CMOS voltage level translators 30 add an inherent delay to the speed at which a memory cell can be addressed since the address signals pass through them. Also, all ECL-to-CMOS translators require a certain amount of chip space for their implementation, and that reduces the number of cells that can be placed on the chip. Further, all ECL-to-CMOS translators 30 dissipate some power, which in turn increases the amount of heat that must somehow be removed from the chip.

Accordingly, a primary object of the invention is to provide an improved architecture for a BiCMOS digital memory chip which operates without any ECL to CMOS translators and which therefore works faster while using less power and less chip space then the prior art.

BRIEF SUMMARY OF THE INVENTION

A digital BiCMOS memory includes a row of memory cells, and an addressing circuit for the row of cells. This row addressing circuit contains a) an input node for receiving an address at ECL voltage levels, b) a first bipolar transistor which passes current to a first voltage supply when the row is deselected by the address, c) a second bipolar transistor which passes current to the first voltage supply when the row is selected by the address, and d) a third bipolar transistor having a base coupled to the collector of one of said first and second transistors. Further, in accordance with the invention, the memory also includes:

1) a second voltage supply whose voltage is smaller in magnitude than said first supply's voltage;

2) field effect transistors in each memory cell which are cross-coupled between ground and the second voltage supply forming set and reset nodes that switch to and above the second supply's voltage;

3) an N-channel field effect transistor in each cell having a source connected to one of the nodes, and a gate connected via a row line directly to the emitter of the third bipolar transistor;

4) a discharging circuit coupled to the row line, for discharging the gate below the second supply voltage plus a threshold voltage for the N-channel transistor in response to a control signal; and, 5) a charging circuit coupled to the collectors of the first, second, and third bipolar transistors for charging the gate above the second supply's voltage plus the N-channel transistor's threshold voltage in response to the ECL address.

By providing the small second supply voltage and by having the set-reset nodes of each memory cell switch no lower then that small voltage, the critical voltage level below which the row line must be discharged in order to deselect the cells is raised up. This is important because with a direct connection from the row line to the emitter of the third transistor, the lowest voltage level to which the row line can be discharged is limited. In particular, the lowest row line voltage is limited to the base voltage of the third transistor minus a base-emitter a forward drop of about 0.8 volts. If that lowest row line voltage exceeds the critical voltage level at which cell deselection occurs, the memory will not work . . . unless as was done in the prior art, an ECL-CMOS converter is placed between the third transistor's emitter and the row line.

BRIEF DESCRIPTION OF THE DRAWINGS

Various features and advantages of the invention are described herein in conjunction with the accompanying drawings wherein.

DETAILED DESCRIPTION

Figure 2:
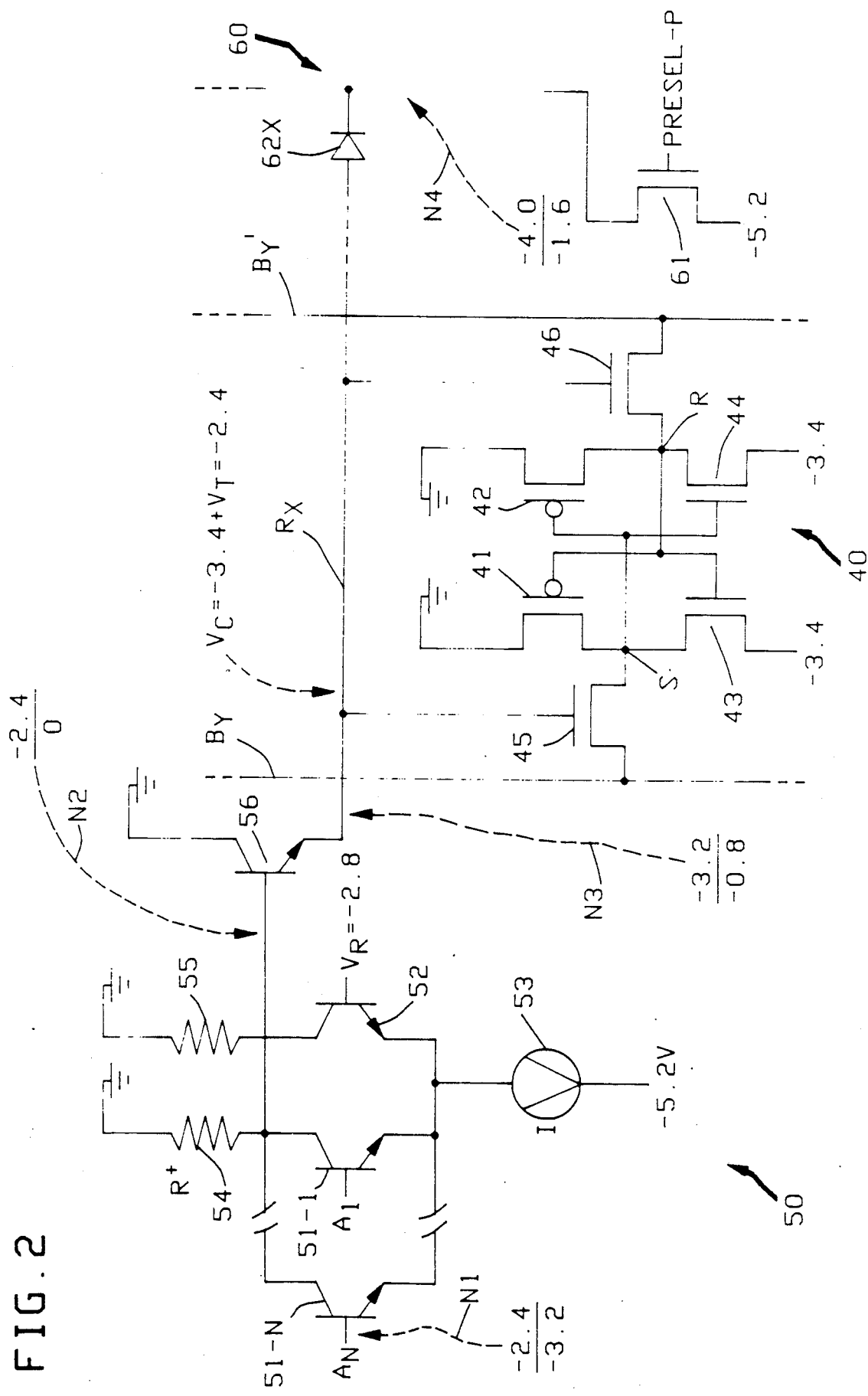
FIG. 2 is a detailed circuit diagram of one preferred embodiment of the invention.

Referring now to FIG. 2, a preferred embodiment of a BiCMOS memory chip will be described in detail. In FIG. 2, reference numeral 40 indicates one memory cell and reference numeral 50 indicates an address decoder which selects the memory cell 40. Of particular importance in the FIG. 2 memory is the fact that the memory cell 40 and the address decoder 50 are connected directly to each other with no ECL-to-CMOS voltage translator between them. How this direct connection is able to work depends on the voltages that occur at various nodes in the FIG. 2 memory. But, before getting into those details, consider first just the memory components and their interconnections.

Memory cell 40 includes two P-channel field effect transistors 41 and 42, and four N-channel field effect transistors 43-46. All of these transistors 41-46 are interconnected as shown between ground and a voltage supply of −3.4 volts. Transistors 41, 42, 43, and 44 are cross-coupled to form a flip-flop having a set node S and a reset node R. In the set state of the flip-flop, only transistors 41 and 44 conduct which places the set node S at ground and the reset node R at −3.4 volts. Conversely in the reset state of the flip-flop, only transistors 42 and 43 conduct which places the reset node R at ground and the set node S at −3.4 volts.

Memory cell 40 is coupled by its transistors 45 and 46 to a row line $R_x$ and a pair of bit lines $B_y$ and $B_y'$. There are multiple memory cells per row, and there are multiple rows. This is indicated in FIG. 2 by the dots in the row lines and the dots in the bit lines.

Address decoder 50 includes a set of N bipolar transistors 51-1 through 51-N, another bipolar transistor 52, a current source 53, two resistors 54 and 55, and one other bipolar transistor 56. All of these components are interconnected as shown between ground and a voltage supply of −5.2 volts. One such decoder is provided for each row of memory cells.

Also included in the FIG. 2 memory is a row discharge circuit 60. It contains a single N-channel transistor 61, and it contains a respective diode $62x$ in each row of cells. Components 61 and $62x$ are coupled as shown between the row lines $R_x$ and the supply voltage of −5.2 volts.

To illustrate how all of the above described components operate and interact, FIG. 2 shows the voltages that occur on various nodes N1–N4 in the memory. Beginning with node N1, the base of each of the transistors 51-1 through 51-N receives one bit of a multi-bit address signal $A_I$ through $A_n$. Those address bits have ECL high and low voltage levels of −2.4 volts and −3.2 volts. Transistor 52 on the other hand has a fixed base voltage of −2.8 volts.

Each read or write operation in the FIG. 2 memory begins by deselecting every row of cells and simultaneously turning on transistor 61. To deselect a row of memory cells, one or more of the address signals $A_I$ through $A_n$ is forced to a high voltage level of −2.4 volts. When that occurs, the corresponding trnasistors 51-1 thru 51-N which receive the high address signals pass all of the current "I" from the current source 53. This current "I" also passes through resistor 54 which produces a voltage drop on node N2.

Preferably, resistor 54 is made as large as it can be without causing any of the transistors 51-1 thru 51-N to go into saturation. This is indicated in FIG. 2 by the symbol R+. Saturation occurs when the collector-base junction becomes forward biased. So resistor 54 is selected to make the voltage on node N2 equal to the highest base voltage of the transistors 51-1 thru 51-N, (i.e. −2.4 volts).

While node N2 is at −2.4 volts, the control signal PRESEL-P on the gate of transistor 61 is forced high. As a result, the emitter of transistor 56 is coupled to −5.2 volts through diode $62x$ and transistor 61.

By the above coupling, the base-emitter junction of transistor 56 is forward biased past its turn-on voltage of about 0.8 volts; and thus transistor 56 conducts. This produces a 0.8 volt base-emitter drop in transistor 56 which makes the voltage at node N3 equal to −2.4 −0.8 or −3.2 volts. A similar voltage drop of 0.8 volts occurs through diode $62x$ which places node N4 at −3.2 −0.8 or −4.0 volts.

Due to node N3 being at −3.2 volts, both of the transistors 45 and 46 in the memory cell are turned-off. That is because the lowest voltage on the set node S and reset node R is −3.4 volts; and to turn on transistors 45 and 46, the voltage on node N3 must be raised to at least −3.4 volts plus a threshold voltage $V_T$. Suitably, the threshold voltage for each of the transistors 45 and 46 is +1.0 volts.

After the above deselection occurs, the read or write operation continues by selecting one particular row of cells and simultaneously turning off transistor 61. To select a row of memory cells, all of the address signals $A_I$ through $A_n$ for that row must be low. When that occurs, all of the transistors 51-1 through 51-N turn off, and so none of the current "I" from generator 53 passes through resistor 54. This in turn produces zero volts on node N2.

With zero volts on node N2 and −3.2 volts on node N3, the base-emitter junction of transistor 56 is forward biased past it's turn-on voltage. Thus transistor 56 conducts and charges the row line $R_x$. This charging continues until the base-emitter drop reaches the turn-on voltage of about 0.8 volts; and, that puts the row line voltage at −0.8 volts. Such a voltage on the row line selects the memory cell 40 since, as was explained above, the transistors 45 and 46 turn on when their gate voltage exceeds −3.4 volts $+V_T$ or −2.4 volts.

Figure 1:
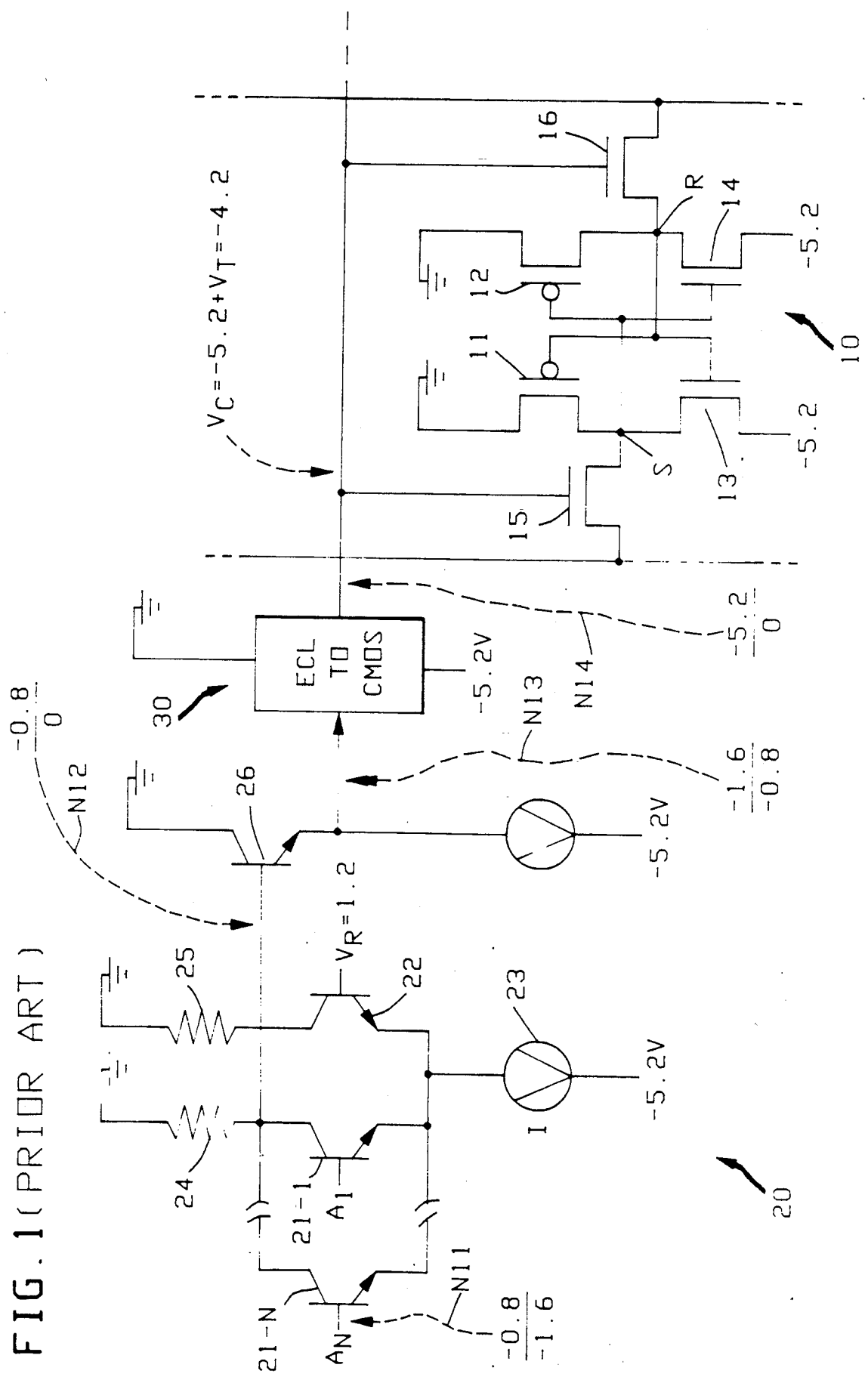
FIG. 1 is a detailed circuit diagram of a prior art BiCMOS memory which is shown for comparison purposes.

For comparison purposes, refer now back to the prior art memory chip of FIG. 1, and consider the voltages that occur at the various nodes labelled N11 thru N15. Node 11 is on the base of the transistors 21-1 thru 21-N in the address decoder 20, and each such base receives a bit of the address signal $A_I$–$A_n$. These bits commonly have high and low ECL voltage levels of −0.8 volts and −1.6 volts.

When all of the address bits $A_I$–$A_n$ are low, none of the current "I" passes through the transistors 21-1 thru 21-N. Thus, the voltage on node N12 goes to zero volts. That in turn produces a voltage of −0.8 volts on node N13 due to the base-emitter drop of 0.8 volts that occurs in transistor 26 between the nodes N12 and N13.

When any one of the address bits $A_I$–$A_n$ is high, then the corresponding transistors 21-1 thru 21-N that receive those bits conduct the current "I". That produces a voltage of −0.8 volts on node N12, which in turn produces a voltage of −1.6 volts on node N13.

In other words, the voltage levels that are produced on node N13 by resistor 24 and transistor 26 are the same as the ECL voltage levels that occur in the input signals $A_I$ thru $A_n$. Those ECL voltages of −0.8 volts and −1.6 volts are then sent through the ECL to CMOS voltage translator 30 in order to generate new CMOS high and low voltages of zero volts and −5.2 volts on node N14. Such a voltage translation is required in the FIG. 1 memory in order to select and deselect the memory cell 10.

In the memory cell 10, the set node S and the reset node R have high and low CMOS voltage states of zero volts and −5.2 volts. Consequently, in order to be able to select and deselect the memory cell, the voltage on node N14 must be able to switch above and below −5.2 volts plus a threshold voltage $V_t$ for transistors 15 and 16. Using a threshold voltage of 1 volt, as was done for transistors 45 and 46 in FIG. 2, the voltage on node 14 must switch above and below −4.2 volts.

That criteria is clearly met when the ECL-to-CMOS translator 30 is provided between the address decoder 20 and the memory cell 10. However, if the voltage converter 30 is removed and node N13 is connected directly to node N14, then the resulting memory simply will not work because the memory cell 10 will always be selected by the ECL voltage levels from the emitter of transistor 26.

Figure 3:
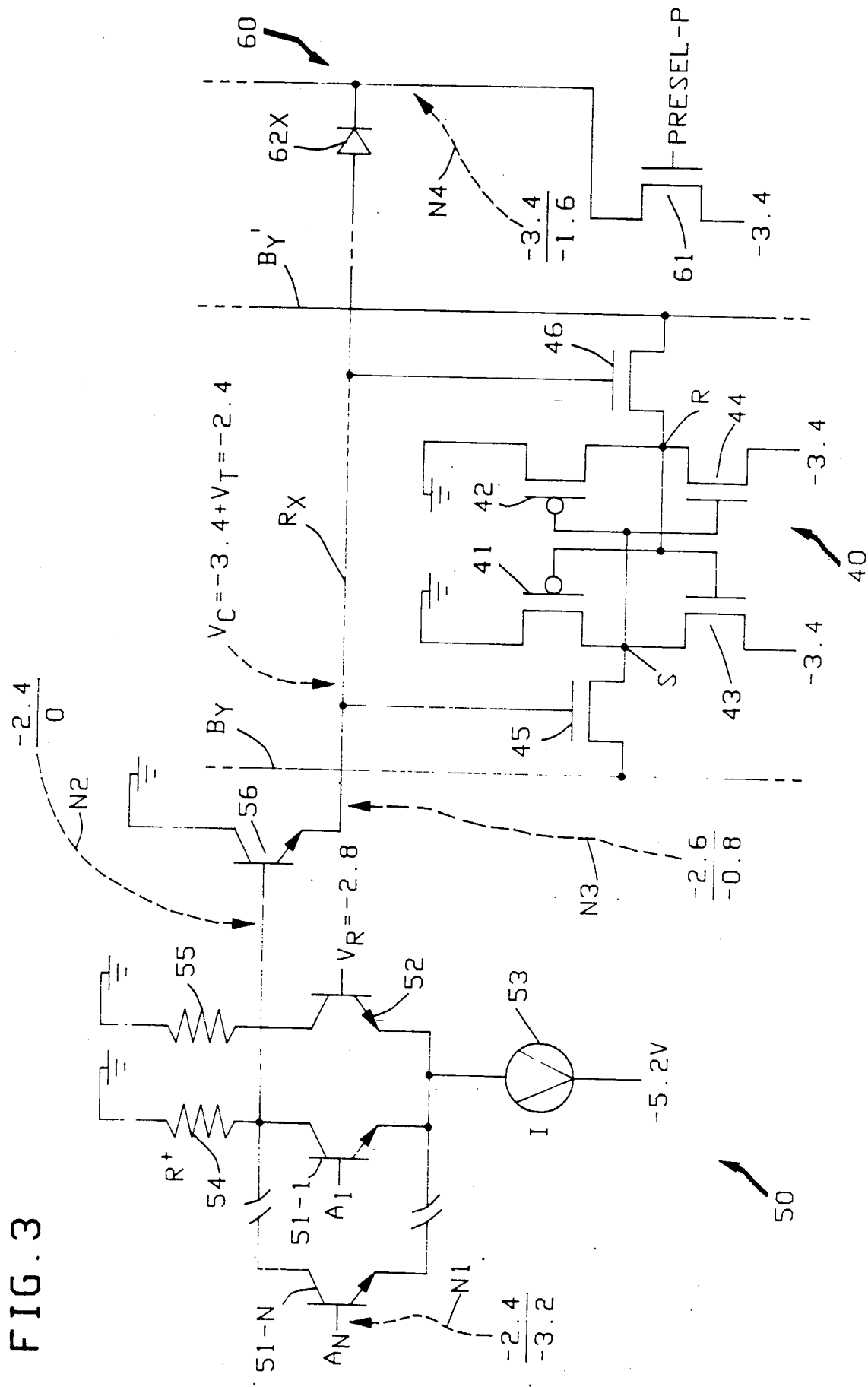
FIG. 3 is a detailed circuit diagram of a second preferred embodiment of the invention; and, FIG. 4 is a detailed circuit diagram of a third preferred embodiment of the invention.

Turning now to FIG. 3, the details of a second embodiment of the invention will be described. This embodiment is identical to the embodiment of FIG. 2 with the exception that the discharge circuit 60 operates at the same supply voltage as the memory cell 40, rather then the same supply voltage as the address decoder 50. In other words, transistor 61 has its drain connected to −3.4 volts rather then −5.2 volts. With this modification, an additional power savings is achieved over the FIG. 2 embodiment.

This power savings occurs during the preselect portion of a memory read or write cycle. At that time, control signal PRESEL-P is high, so transistor 61 turns-on and couples node N4 to −3.4 volts. At the same time, one or more of the address signals $A_1$–$A_n$ are forced high, and that causes the current "I" to pass through resistor 54 and produce the voltage of −2.4 volts on node N2.

With node N2 at −2.4 volts and node N4 at −3.4 volts, transistor 56 will not pass any current from ground through diode $62_x$. If transistor 56 did conduct, then a forward diode drop of about 0.8 volts in diode $62_x$ must occur; and that in turn would raise the voltage on node N3 to −3.4 +0.8 or −2.6 volts. Thus, the base emitter voltage of transistor 56 would be −2.4 volts minus −2.6 volts or 0.2 volts. But, transistor 56 will not turn on until its base-emitter is forward biased by at least 0.8 volts.

Consequently, during the preselect portion of a read/write cycle, transistor 56 in each of the rows of the FIG. 3 memory is turned off. And, a turned-off transistor dissipate almost zero power.

Next, referring to FIG. 4, still another embodiment of the invention will be described. This embodiment is similar to the FIG. 3 embodiment with the exception that the discharge circuit 60 is replaced with a different discharge circuit 70. With this modification, the FIG. 4 memory will operate faster then the previously described embodiments of FIGS. 2 and 3.

Included in the discharge circuit 70 is a bipolar transistor 71, a N-channel field effect transistor 72, and a resistor 73. All of these components are interconnected as shown between the row line $R_x$ and the supply voltage of −3.4 volts. One such discharge circuit 70 exists for each of the row lines $R_x$.

During the preselect portion of the read/write cycle, the control signal PRESEL-P is high. That turns on transistor 72 and couples the base of transistor 71 to the row line $R_x$. If the row line has a high voltage, transistor 71 will turn on and discharge the row line until its base voltage is reduced to −3.4 +0.8 or −2.6 volts.

After this discharging is complete, the actual read/-write of the memory cell 40 occurs by forcing the PRESEL-P control signal low and forcing all of the address signals $A_1$–$A_n$ low. That will raise the voltage on node N2 to zero volts, which in turn will cause transistor 56 to charge the row line $R_x$ to −0.8 volts. Such charging of a row line in the FIG. 4 memory will occur quickly because all of the row lines are isolated from each other and node N4 by transistor 72, and that reduces any parasitic capacitance which is associated with the row lines. By comparison, in the memories of FIGS. 2 and 3, all of the row lines $R_x$ are coupled to node N4 through diode 62X, and thus node N4 adds to the parasitic capacitance of each row line.

Figure 4:
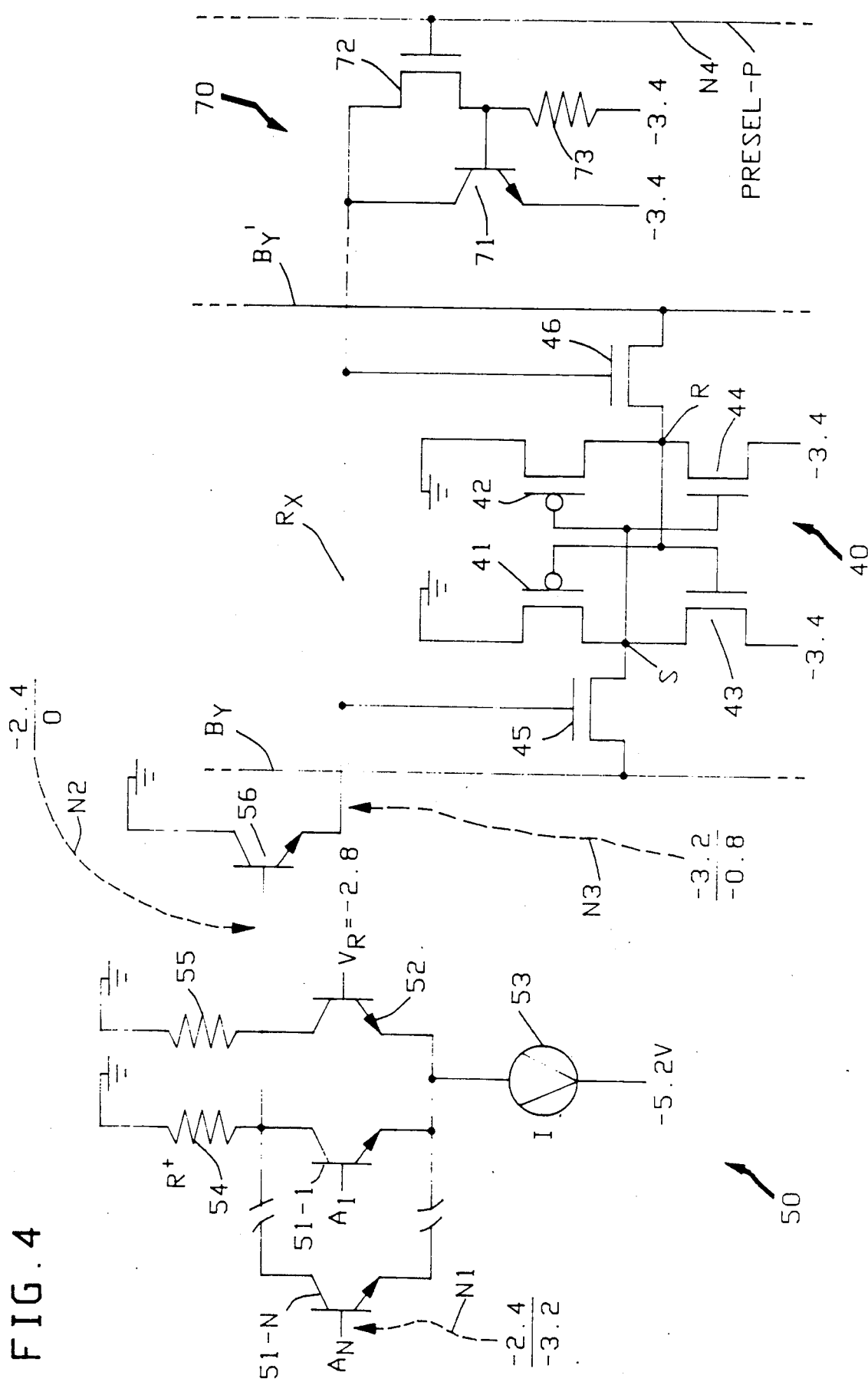

Likewise, the discharging of the row line $R_x$ in the FIG. 4 memory occurs in isolation. This is in comparison to the memories of FIGS. 2 and 3 wherein each row line is discharged through diode $62_x$ and through node N4 which again adds parasitic capacitance.

Various preferred embodiments of the invention have now been described in detail. In addition, however, any changes and modifications can be made to these details without departing from the nature and spirit of the invention.

For example, in the memory cell 40 of FIGS. 2, 3, and 4, the transistors 41 and 42 can be replaced with resistors. Also, one of transistors 45 and 46 can be eliminated along with its corresponding bit line.

In addition, the supply voltage of the memory cell 40 is not limited to −3.4 volts, and the ECL voltage levels of the address signals are not limited to −2.4 volts and −3.2 volts. Other voltage levels can be used so long as the high ECL level of the address plus the base-emitter drop of transistor 56 is less then the supply voltage of memory cell 40 plus the threshold voltage of transistors 45 and 46.

Further, in the address decoder of FIGS. 2, 3, and 4, all of the transistors 51-1 thru 51-N can be replaced with a single transistor whose base receives an ECL row select signal. Also, the complement of that row select signal can be sent to the base of transistor 52 in place of the fixed reference voltage $V_r$. Further, the resistors 54 and 55 can be interchanged if the base of transistor 56 is connected to the collector of transistor 52 rather than transistor 51-1.

Accordingly, it is to be understood that the invention is not limited to the illustrated embodiments but is defined by the appended claims.

What is claimed is:

1. A digital memory of the type which includes a row of memory cells and a row addressing circuit for the row; said row addressing circuit including a) an input node for receiving an ECL address, b) a first bipolar transistor which passes current to a first voltage supply when the row is deselected by said address, c) a second bipolar transistor which passes current to said first voltage supply when the row is selected by said address, and d) a third bipolar transistor having a base coupled to the collector of one of said first and second transistors; wherein said memory also includes:

a second voltage supply whose voltage is smaller in magnitude then the first supply's voltage;

field effect transistors in each cell which are cross-coupled between ground and said second voltage supply forming set and reset nodes that switch to and above the second supply's voltage;

an N-channel field effect transistor in each cell having a source connected to one of said nodes, and a gate connected via a row line directly to the emitter of said third bipolar transistor;

a discharging means coupled to said row line, for discharging said gate below said second supply's voltage plus a threshold voltage for said N-channel transistor in response to a control signal; and, a charging means coupled to the collectors of said first, second, and third bipolar transistors for charging said gate above the second supply voltage plus said threshold voltage in response to said ECL address.

2. A memory according to claim 1 wherein said charging means includes a resistor coupled to the collector of said one bipolar transistor which there generates a voltage V when said row is deselected by said address such that V minus a base-emitter drop in the third transistor is lower than said second supply's voltage plus a threshold voltage for said N-channel transistor.

3. A memory according to claim 2 wherein said discharging means includes a respective diode in each row of cells, and a single field effect transistor which couples all of said diodes to a discharge node in response to a control signal.

4. A memory according to claim 3 wherein the magnitude of said second supply voltage minus a forward biased voltage drop across said diode minus said voltage produced by said resistor is less than a threshold voltage for said third bipolar transistor.

5. A memory according to claim 4 wherein said first bipolar transistor is paralleled by multiple bipolar transistors, each of which has a base that receives a respective bit of said ECL address.

6. A memory according to claim 5 wherein said base of said third bipolar transistor is coupled to said collector of said first bipolar transistor.

7. A memory according to claim 6 wherein said cross-coupled field effect transistors are complementary field effect transistors.

8. A memory according to claim 2 wherein said discharging means includes a respective bipolar transistor in each row of cells which couples only that particular row to a discharge node in response to a control signal.

9. A memory according to claim 8 wherein the magnitude of said second supply voltage minus a forward biased voltage drop across said diode minus said voltage produced by said resistor is less than a turn-on voltage for said third bipolar transistor.

10. A memory according to claim 9 wherein said first bipolar transistor is paralleled by multiple bipolar transistors, each of which has a base that receives a respective bit of said ECL address.

11. A memory according to claim 10 wherein said base of said third bipolar transistor is coupled to said collector of said first bipolar transistor.

12. A memory according to claim 11 wherein said cross-coupled field effect transistors are complementary field effect transistors.

* * * * *